(12) United States Patent
Makita et al.

(10) Patent No.: US 6,888,870 B2
(45) Date of Patent: May 3, 2005

(54) SEMICONDUCTOR LASER AND METHOD FOR MANUFACTURING THE SAME

(75) Inventors: Koji Makita, Akou (JP); Hideto Adachi, Okayama (JP); Toshiya Kawata, Okayama (JP); Hiroshi Asaka, Hirakata (JP); Osamu Imafuji, Takatsuki (JP); Toshiya Fukuhisa, Matsubara (JP); Akira Takamori, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 276 days.

(21) Appl. No.: 10/210,656

(22) Filed: Jul. 31, 2002

(65) Prior Publication Data

US 2003/0026307 A1 Feb. 6, 2003

(30) Foreign Application Priority Data

Aug. 1, 2001 (JP) ........................................ 2001-233656

(51) Int. Cl.[7] ................................................ H01S 5/00
(52) U.S. Cl. .......................................... 372/46; 372/44
(58) Field of Search ................................ 372/46, 44, 98

(56) References Cited

U.S. PATENT DOCUMENTS

| | | | |
|---|---|---|---|
| 6,256,331 B1 * | 7/2001 | Kitoh et al. ................... | 372/46 |
| 2002/0122447 A1 * | 9/2002 | Fukunaga et al. ............. | 372/43 |
| 2002/0139989 A1 * | 10/2002 | Matsuyama ................... | 257/98 |

FOREIGN PATENT DOCUMENTS

| JP | 11-251679 | 9/1999 |
|---|---|---|
| JP | 2000-164986 | 6/2000 |

OTHER PUBLICATIONS

Hashimoto et al. "Aging Time Dependence of Catastrophic Optical Damage (COD) Failure of a 0.98–$\mu$m GaInAs–GaInP Strained Quantum–Well Laser" IEEE Journal of Quantum Electronics, col. 33, No. 1, Jan. 1997, pp 66–70.

Mar. 2000, Miyashita et al. "29a–N–7, High–Power and Low Operation Current Laser with Real Refractive Index Waveguide for DVD–RAM" The 47th Spring Meeting, The Japan Society of Applied Physics and Related Societies, Aoyama Gakuin University, Tokyo, Japan, Extended abstract p. 1149.

May 1994, Isamu Akazaki "III–V Compound Semiconductors" Published by Baifukan, Tokyo, Japan, pp 312–313.

* cited by examiner

*Primary Examiner*—Paul Ip
*Assistant Examiner*—Hung T Vy
(74) *Attorney, Agent, or Firm*—Merchant & Gould P.C.

(57) ABSTRACT

A semiconductor laser has a first conduction-type cladding layer, an active layer, and a second conduction-type cladding layer formed on a first conduction-type semiconductor substrate. The second conduction-type cladding layer has a mesa-type stripe-shaped recessed portion in at least four spots, so as to form a central ridge portion, which constitutes a ridge-type current confinement portion, and two or more lateral ridge portions, which are positioned on both sides of the central ridge portion, have a height larger than to that of the central ridge portion, and include the second conduction-type cladding layer. An insulation film with a lower refractive index than the second conduction-type cladding layer is formed in a pair of stripes disposed respectively in the regions from the side surface of the second conduction-type cladding layer on both side surfaces of the central ridge portion toward the outside. The insulation film is not formed on the central ridge portion.

23 Claims, 13 Drawing Sheets

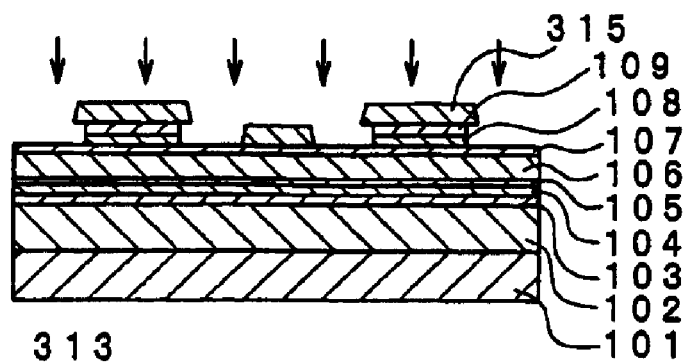
FIG. 5A1
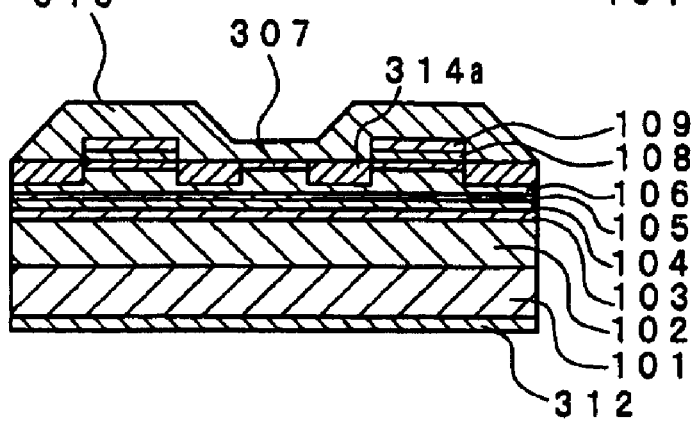
FIG. 5A2
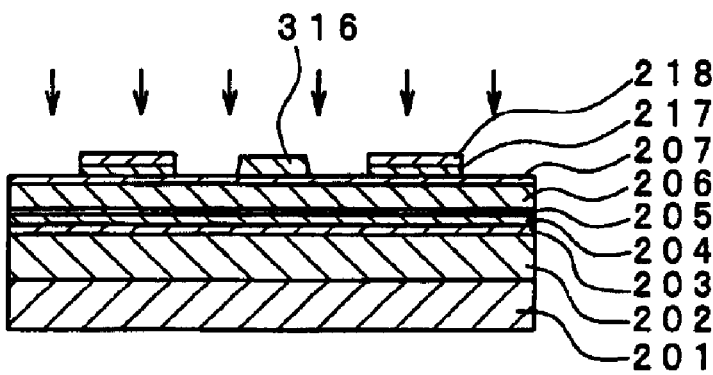
FIG. 5B1
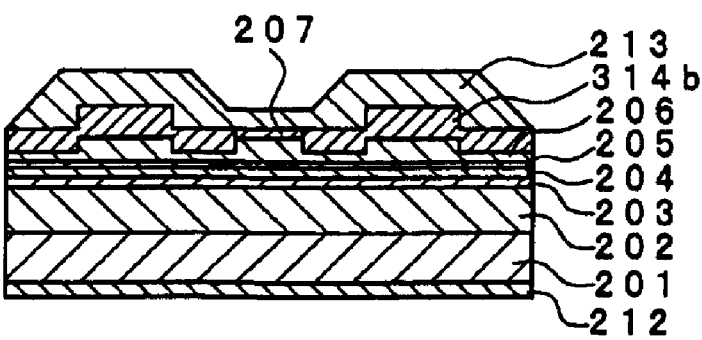
FIG. 5B2

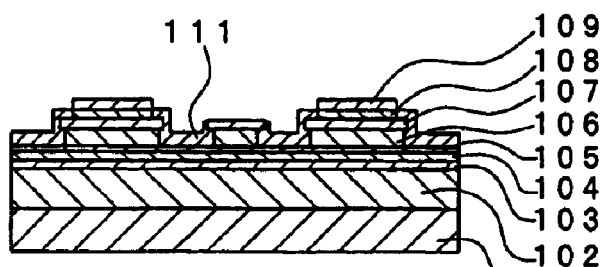
FIG. 6A1
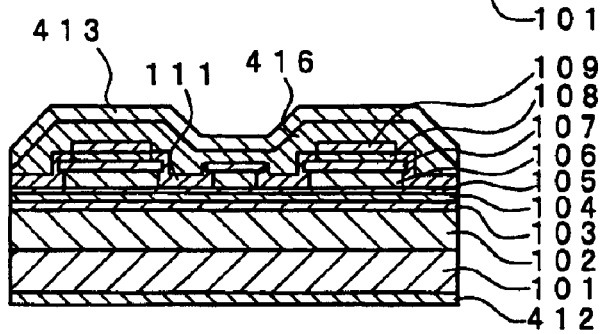
FIG. 6A2
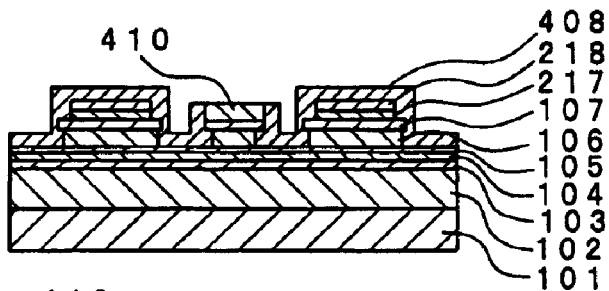
FIG. 6B1
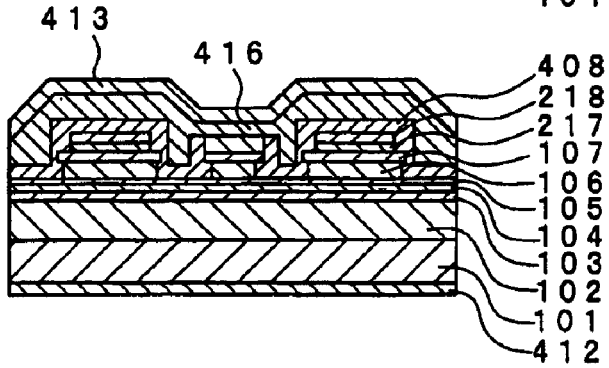
FIG. 6B2
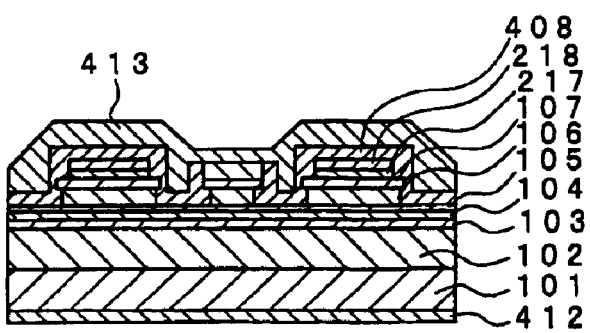
FIG. 6C

US 6,888,870 B2

SEMICONDUCTOR LASER AND METHOD FOR MANUFACTURING THE SAME

BACKGROUND OF THE INVENTION

1. Field of the Invention

The present invention relates to a semiconductor laser, and in particular to a semiconductor laser used as the light source for an optical disk system, for information processing, or for optical communications.

2. Description of Related Art

Conventional semiconductor lasers employed as the light source in optical disk systems have been manufactured, for example, by the following process. First, a first crystal growth step is conducted to form at least a first conduction-type cladding layer, an active layer, and a second conduction-type cladding layer in that order on a first conduction-type semiconductor substrate. Then a stripe formation process for forming a region where current is introduced to the active layer is performed, and then epitaxial growth to bury the stripe portion is performed.

For example, the process for manufacturing a ridge-type semiconductor laser element like that shown in FIGS. 9A to 9E generally includes three crystal growth steps (formation of the double heterostructure, formation of the current blocking layer, and formation of the burying layer). First, as shown in FIG. 9A, an n-type cladding layer 2, an active layer 3, and a p-type cladding layer 4 are deposited and grown on an n-type substrate 1 in that order by a first crystal growth step. Then, as shown in FIG. 9B, the p-type cladding layer 4 is etched to form a ridge portion 4a by a process employing photolithography. Next, as shown in FIG. 9C, an n-type current blocking layer 8 is formed through a second crystal growth step. Then, as shown in FIG. 9D, a p-type burying layer 9 is formed through a third crystal growth step. Lastly, as shown in FIG. 9E, a p-side ohmic contact electrode 13 is formed on the p-type burying layer 9 and an n-side ohmic contact electrode 12 is formed on the bottom surface of the n-type substrate 1.

The groove-type semiconductor laser element shown in FIGS. 10A to 10D also requires two crystal growth steps (formation of the double heterostructure and formation of the burying layer). First, as shown in FIG. 10A, an n-type cladding layer 2, an active layer 3, a p-type cladding layer 4, and an n-type current blocking layer 8 are deposited and grown in that order on an n-type substrate 1 through a first crystal growth step. Next, as shown in FIG. 10B, the n-type current blocking layer 8 is etched to form a groove portion 8a by a process employing photolithography. Then, as shown in FIG. 10C, a p-type burying layer 9 is formed in a second crystal growth step. Lastly, as shown in FIG. 10D, a p-side ohmic contact electrode 13 and an n-side ohmic contact 12 are formed.

This plurality of crystal formation steps was a major hurdle in reducing the manufacturing costs for laser chips. Accordingly, as a method for omitting the burying crystal growth step so as to fabricate a semiconductor laser element through a single crystal growth step, an element that has a ridge-type waveguide structure and that constricts the current and confines light by a dielectric film made of $SiO_2$ or $Si_3N_4$ or the like has been developed and produced (for example, see J. Hashimoto et. al., IEEE J. Quantum Electron, vol. 33, pp. 66–70, 1997). An example of this method is shown in FIGS. 11A to 11D. First, as shown in FIG. 11A, in a first crystal growth step, an n-type cladding layer 2, an active layer 3, and a p-type cladding layer 4 are deposited and grown in that order on an n-type substrate 1 so as to form a double heterostructure. Next, as shown in FIG. 11B, the p-type cladding layer 4 is etched to form a ridge portion 4a by a process employing photolithography. Then, as shown in FIG. 1C, an insulating film (dielectric film) 11 is formed and then etched using a photoresist mask (not shown) to expose the p-type cladding layer 4. Lastly, as shown in FIG. 1D, a p-side ohmic contact electrode 13 and an n-side ohmic contact electrode 12 are formed.

However, with the element shown in FIG. 11D, the unevenness formed in the element surface is affected by the ridge portion and becomes large because a burying crystal growth step is not performed after the stripe is formed. When the electrode side surface having this uneven surface is adopted as the bonding surface during assembly of the semiconductor laser, there is the problem that stress during chip bonding tends to concentrate in the ridge portion 4a, thereby deteriorating the properties of the semiconductor laser.

In a presentation by Miyashita et. al. at the Japan Society of Applied Physics Annual Meeting in the spring of 2000 (presentation No. 29a-N-7, "Effective Refractive Index Type High-Output Low-Operation-Current Laser for DVD-RAM"), it was reported that by also forming protruding portions to the left and right of the ridge portion, it is possible to reduce damage during bonding, and that a significant improvement in laser properties can be achieved by adopting such a structure for a high output red semiconductor laser element. However, the height difference between the ridge portion and the other protruding portions was the thickness of the $SiO_2$ film employed for current confinement (approximately 0.1 $\mu$m).

Also, JP H12-164986A discloses a method to keep stress from concentrating at the ridge portion during assembly by using regrowth to form protruding portions that are higher than and sandwich the ridge portion. This example is shown in FIGS. 12A to 12D. First, as shown in FIG. 12A, an n-type cladding layer 2, and active layer 3, and a p-type cladding layer 4 are deposited and grown in that order on an n-type substrate 1 through a first crystal growth step, and furthermore an oxidation prevention layer 10 is laminated. Next, as shown in FIG. 12B, a protective film 14 serving as an insulation layer is deposited, and photolithography is used to form a resist mask to remove the outside regions of the protective film 14, after which an n-type current blocking layer 8 is formed in those regions in a first selective growth step. Then, as shown in FIG. 12C, photolithography is used to provide an aperture portion for ridge formation in the center portion of the protective film 14, and a p-type second cladding layer 15 and a p-type contact layer 16 are deposited and grown in that order on this aperture portion and on the n-type current blocking layers 8 on both sides in a second selective growth step. Finally, as shown in FIG. 12D, a p-side ohmic contact electrode 13 and an n-side ohmic contact electrode 12 are formed. However, the selective growth steps required by this manufacturing method make it difficult to reduce the cost of the chip.

Moreover, JP H11-25 1679A discloses the use of the structure shown in FIG. 13 as a method for reducing damage due to unevenness during bonding in a ridge-type semiconductor laser for which a burying growth step is performed. That is, a second p-side ohmic contact electrode 14 is provided to make the thickness of the electrode on the uneven surface side thick at the recessed portion and thin at the protruding portion, so that the unevenness in the semiconductor surface is reduced. It should be noted that a protruding portion is also unsatisfactory in conventional ridge-type semiconductor lasers for which a burying growth step is performed.

The following four points are the main problems for the semiconductor laser element fabricated by a single crystal growth step and shown in FIGS. 11A to 11D.

The first problem is the deterioration of laser properties due to damage caused during bonding, as mentioned above. With the structure proposed by Miyashita et. al., the difference in height between the ridge portion and the other protruding portions is too small, and thus damage during bonding cannot be reduced sufficiently and there is a high risk that large stress will be applied to the ridge portion as well. Furthermore, with the procedure mentioned in JP H11-251679A, a difference of about several m in the electrode film thickness must be formed at the chip surface, the increase in thickness of the electrode film leads to larger discrepancies in the electrode film thickness, and so mass-productivity drops for devices that are assembled with the uneven surface as the reference surface.

The second problem is that a semiconductor laser element with this structure has a larger thermal resistance than conventionally structured elements. This is because the dielectric film made of $SiO_2$ or $Si_3N_4$, for example, has a considerably lower thermal conductivity than the semiconductor film, and thus a semiconductor laser element with the majority of its surface covered by a dielectric film has inferior heat dissipation properties as compared with conventionally structured elements. This leads to concerns regarding the deterioration of laser properties, especially at elevated temperatures, and a drop in reliability.

The third problem is that damage at a ridge portion due to the concentration of stress at the ridge portion and production defects such as cracks occur more easily during the cleavage process in the direction perpendicular to the stripe direction, which is performed for the purpose of forming in the chip end surface the mirror necessary to form a Fabry-Perot resonator. It is thought that the primary reason why stress tends to concentrate at the ridge portion is that there is a larger difference in height at the protruding portions than in a conventionally structured element because burying growth is not performed in the former. On the other hand, if the structure proposed by Miyashita et. al. or the method mentioned in JP H12-164986A is adopted, then a plurality of protruding portions are formed in the element surface, and thus it is conceivable that the stress concentrating at the ridge portion will be reduced. However, simply having a plurality of protruding portions is not enough, and no effect can be anticipated if the other protruding portions are spaced considerably from the ridge portion. There is no mention by Miyashita et. al. of the spacing between the ridge portion and the other protruding portions. Also, with the structure mentioned in JP H12-164986A, regrowth of the ridge portion is performed with the insulation film serving as a mask, and thus the insulation film is not formed at the ridge portion slope. Consequently, stress is easily concentrated at the boundary portion between the ridge bottom portion and the insulation film, and the regrowth interface is close, so that crystallinity differences near the ridge bottom portion tend to cause damage such as cracking to the ridge bottom portion.

The fourth problem is a reduction in the contact area with the electrode as a result of the burying growth step not being performed, resulting in an increase in element resistance. The increase in resistance leads to diminished frequency properties for the element and more power consumption, among others. JP H12-164986A discloses a method for forming an electrode at the ridge portion slope in order to increase the contact area and reduce the resistance. However, in general, the ridge portion is designed to have a composition with high concentration of Al, and a semiconductor layer surface with a high Al composition oxidizes quickly, frequently leading to the problem of electrode peeling.

SUMMARY OF THE INVENTION

It is an object of the present invention to provide a semiconductor laser which can be manufactured in a process that includes only one crystal growth step, which has a low cost structure in which a dielectric film constricts the current and confines the light, and in which stress concentrating at the ridge portion during assembly is reduced, thus increasing its capacity for mass production.

It is a further object of the present invention to improve the heat dissipation properties of the element, to reduce production defects such as end surface cracking during the cleavage process, and to reduce element resistance.

A semiconductor laser of the present invention is of a ridge-type current confinement structure, and has a first conduction-type cladding layer, a second conduction-type cladding layer, and an active layer sandwiched between these cladding layers, formed on a first conduction-type semiconductor substrate. The second conduction-type cladding layer has mesa-type stripe-shaped recessed portions in at least four spots, thereby forming a central ridge portion, which constitutes a ridge-type current confinement portion, and two or more lateral ridge portions of a height larger than that of the central ridge portion, which are positioned on both sides of the central ridge portion, and which include the second conduction-type cladding layer. An insulation film with a lower refractive index than the second conduction-type cladding layer is formed in a pair of stripes disposed respectively in the regions from the side surface of the second conduction-type cladding layer on both side portions of the central ridge portion toward the outside. The insulation film is not formed on the central ridge portion.

This configuration dissipates the pressure that is received by the element surface during assembly through the lateral ridge portions and alleviates stress concentrated at the central ridge portion. Moreover, the existence of the lateral ridge portions allows a reduction in defects such as end surface cracking during the cleavage process.

Furthermore, it is possible to adopt a configuration where a current blocking layer is formed on the lateral ridge portions, the insulation film is not formed on the lateral ridge portions, and the height of the central ridge portion is lower than the height of the lateral ridge portions. Thus, the heat dissipation properties of the element are improved because a dielectric film with a low thermal conductivity is not formed on the lateral ridge portions.

It is also possible to adopt a configuration in which a current blocking layer is formed on the uppermost layer of the lateral ridge portions, or in which the current blocking layer is a first conduction-type semiconductor layer or a high resistance semiconductor layer. Also, by adopting a configuration in which the current blocking layer is formed concurrent with the first crystal growth step, it is possible to achieve a reduction in element resistance. This is because, for example, forming an n-type semiconductor layer of at least a certain film thickness (greater than about 0.3 $\mu$m) on the surface of a p-type semiconductor layer inhibits hydrogen atom-induced passivation of the Zn impurities in the p-type semiconductor layer and increases the activation yield of the Zn. A similar effect also can be achieved in an undoped semiconductor layer, but the present configuration makes it possible to obtain the above effects with a minimum number of crystal growth layers and with a simple process.

The current confinement layer of the above configured semiconductor laser can be formed with either of a semiconductor layer with a different conduction-type than the central ridge portion or a surface layer of the lateral ridge portions provided with high resistance by ion implantation, for example. In a current confinement structure achieved by a semiconductor layer, an insulation film made of $SiO_2$ or the like with a high thermal resistance must be formed between the ridge portions, but in a current confinement structure achieved by a high resistance layer, the insulation film only needs to be formed on the side surfaces of the central ridge portion (in the case of a gain guide laser, an insulation film is not necessary), and thus the heat dissipation properties of the element can be increased further.

In the problem at hand of further increasing the heat resistance properties, it is preferable that the lateral ridge portions in the above configuration have the widest area possible and are near the central ridge portion. On the other hand, giving consideration to the stabilization of the ridge portion formation process, a wide etching area must be secured in order to confirm the end point of the etching. Consequently, in the above configuration, it is preferable that (a+b)/L is 0.5 or less, where a symbol a represents a width of the central ridge portion, a symbol b represents a total width of the lateral ridge portions, and a symbol L represents a width at which the central ridge portion is repeated. Also, it is preferable that a spacing d between the central ridge portion and the lateral ridge portions is 30 $\mu$m or less.

The value of d influences the action of inhibiting cracking, for example, around the central ridge portion during cleavage. Thus, as shown in FIGS. 14A and 14B, by forming a wide etching region outside the lateral ridge portions, it is possible to suppress leaks (short circuits) in the element that are caused by an adhesive agent such as solder when assembly is performed with the epitaxial surface as the junction surface. In FIG. 14A, the numeral 20 denotes a laser element with the above configuration, and which has a central ridge portion 21 and lateral ridge portions 22 formed on either side of the central ridge portion 21. The laser element 20 is joined to a sub-mount 24 by an adhesive agent 23. As shown in FIG. 14A, by increasing the distance Y1 from the junction surface to the surface of the semiconductor layer (the same applies for the distance Y2 in FIG. 14B), it is possible to inhibit wraparound of the adhesive agent 23 and obtain stable element properties.

Also, in a device (holographic element) where the semiconductor laser, the receiving element, and optical components such as a mirror are made into a single unit, a joining portion (stage) 25 of the laser element 20 is designed narrower than the width of the laser element, as shown in FIG. 14B. Thus, a configuration is achieved in which the adhesive agent 23 easily flows downward and short circuits in the laser element 20 are further suppressed. This configuration conversely obviates the formation of the lateral ridge portions up to the chip boundary. For the above reasons, the element of the present invention, as shown in FIGS. 14A and 14B, more preferably has a configuration in which the boundary portion of the element is etched. An etching region 26 is a region at the edge of the element that is shaved away by the etching performed during formation of the ridge portions, and is preferably set as wide as possible from the element edge. The value set for the etching region 26 will change depending on the above values of a, h, d, and L, but it is preferably at least 10 $\mu$m.

By forming a window structure in the end face portion of the above configured semiconductor laser element, it is possible to suppress the deterioration of the end surface that accompanies a semiconductor element having a low operating current and a high output. Such a window structure has a configuration in which a region that absorbs only small amounts of light at the emission wavelength is made in a predetermined region in the vicinity of the end surface by high concentration doping of the active layer with a dopant such as Zn or Si, and in which the injection of carriers into the active layer does not occur due to current confinement. The width of the window region is preferably 15 to 30 $\mu$m from the element end surface.

The above configuration can be adopted for not only a configuration in which the burying crystal growth step has been omitted, but also for a ridge-type semiconductor laser for which a burying growth step is performed. Fabricating the element so that the lateral ridge portions are highest, even after the burying crystal growth step, makes it possible to solve the above problem. Furthermore, element resistance also can be reduced because there is an increase in the contact area with the electrodes.

Also, with a semiconductor laser of the above configuration, and in particular with a configuration in which the burying crystal growth step has been omitted, the contact area with the electrodes is equivalent to the area of the contact layer on the central ridge portion, so that the tendency for an increase in element resistance cannot be avoided. In the case of a ridge-type semiconductor laser, the dimensions of the ridge bottom portion determine the current confinement area (stripe width), so that by forming a ridge with a reverse mesa structure (the width at the top portion of the ridge is greater than the width at the bottom portion of the ridge) it is possible to reduce element resistance without changing element properties such as the flare angle. The major problem with reverse mesa structures is element damage during the cleavage process. However, by providing lateral ridge portions the cleavage process is stabilized. On the other hand, if a configuration in which the burying crystal growth step is performed or if the stripe width can be designed sufficiently wide and a sufficiently wide width can be taken for the top portion of the central ridge portion, then an ordinary regular mesa structure (the width at the top portion of the ridge is smaller than the width at the bottom portion of the ridge) can be adopted.

In order to achieve the above configuration, the semiconductor laser manufacturing method according to the present invention, in a case where a burying crystal growth step is not performed, includes: forming at least a first conduction-type semiconductor layer, an active layer, and a second conduction-type semiconductor layer on a first conduction-type semiconductor substrate with (100) as a primary face; etching the second conduction-type semiconductor layer in a stripe shape in the <011> direction to form at least four recessed portions; forming an insulation layer with a lower refractive index than the second conduction-type cladding layer over the surface; removing the insulation film on the second conduction-type semiconductor layer by etching; and forming an electrode that forms an ohmic junction with the second conduction-type semiconductor layer.

In a case where the heat dissipation properties of the element are increased by adopting a configuration in which a current blocking layer is formed on the lateral ridge portions and the insulation film is not formed on the surface of the lateral ridge portions, a manufacturing method includes: forming a first conduction-type cladding layer, an active layer, a second conduction-type cladding layer, a second conduction-type contact layer, and a first conduction-type current blocking layer on a first conduction-type semiconductor substrate with (100) as a primary face; etching the first conduction-type current blocking layer in a stripe shape in the <011> direction to leave the lateral ridge portions; etching the exposed second conduction-type contact layer in a stripe shape in the <011> direction, leaving the central ridge portion and the lateral ridge portions; using the second conduction-type contact layer as a mask and etching the second conduction-type cladding layer in a stripe shape in the <011> direction; forming an insulation film with a lower refractive index than the second conduction-type cladding layer over the surface; removing the insulation film on the central ridge portion and the lateral ridge portions by etching; and forming an electrode that forms an ohmic junction with the second conduction-type contact layer.

Also, for the purpose of reducing element resistance, a manufacturing method in a case where the Zn activation yield is to be increased adopts a crystal growth step in which in the above method the first conduction-type current blocking layer is an n-type semiconductor layer and the second conduction-type cladding layer and the second conduction-type contact layer are p-type semiconductor layers.

For the purpose of further increasing the heat dissipation properties, in a case of a semiconductor laser element where current confinement is performed by providing high resistance through ion implantation, for example, the above manufacturing method is modified to substitute the first conduction-type current blocking layer with a second conduction-type semiconductor layer and provide high resistance through ion implantation to the second conduction-type semiconductor layer.

To suppress end surface deterioration that accompanies giving the semiconductor element a low operating current and a high output, the manufacturing method also can be modified to form a window structure in the end surface portion of the semiconductor laser element.

It is possible to use the following structural materials in the semiconductor laser element and the manufacturing method thereof according to the present invention.

(1) The semiconductor substrate is GaAs, and the cladding layers, the active layer, the current blocking layer, and a burying layer are Group III–V compound semiconductors including at least one chosen from the group consisting of Al, Ga, As, P, and In.

(2) The semiconductor substrate is InP, and the cladding layers, the active layer, the current blocking layer, and a burying layer are Group III–V compound semiconductors including at least one chosen from the group consisting of Al, Ga, As, P, and In.

(3) The semiconductor substrate is GaN, sapphire, or SiC, and the cladding layers, the active layer, the current blocking layer, and a burying layer are Group III–V compound semiconductors including at least one chosen from the group consisting of Ga, In, and N.

It is also preferable that the insulation film is formed in a single layer or a plurality of layers chosen from the group consisting of $SiO_2$, $SiN_x$, SiON, $Al_2O_3$, ZnO, SiC, and amorphous Si.

BRIEF DESCRIPTION OF THE DRAWINGS

FIGS. 5A1 and 5A2 are cross-sectional views showing the structure and manufacturing method of the ridge-type semiconductor laser according to a third embodiment of the present invention.

FIGS. 5B1 and 5B2 are cross-sectional views showing the structure and the manufacturing method of an applied example of the ridge-type semiconductor laser according to the third embodiment.

FIGS. 6A1 and 6A2 are cross-sectional views showing the structure and the manufacturing method of the ridge-type semiconductor laser according to a fourth embodiment of the present invention.

FIGS. 6B1 and 6B2 are cross-sectional views showing the structure and the manufacturing method of a modified example of the ridge-type semiconductor laser according to the fourth embodiment.

FIG. 6C is a cross-sectional view showing the structure of a modified example of the ridge-type semiconductor laser of the fourth embodiment.

DESCRIPTION OF THE PREFERRED EMBODIMENTS

First Embodiment

FIGS. 1A to 1E show the structure and the manufacturing process of the semiconductor laser element according to a first embodiment of the invention. The first embodiment is an example in which the present invention is adopted for a ridge-type semiconductor laser element that uses an AlGaAs based material.

Figure 1A:
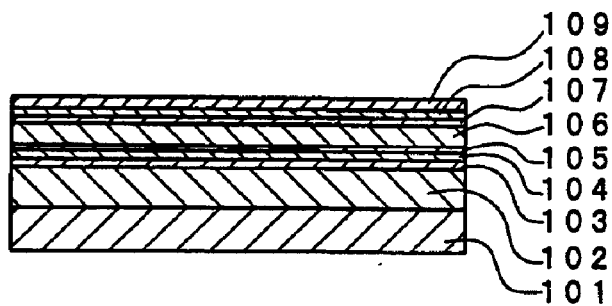
FIGS. 1A to 1E are cross-sectional views showing the structure and manufacturing method of the ridge-type semiconductor laser according to a first embodiment of the present invention.

The structure and manufacturing process of the present semiconductor laser element are described with reference to FIGS. 1A to 1E. First, an n-GaAs substrate 101 is set inside a crystal growth apparatus (not shown), and as shown in FIG. 1A, an n-AlGaAs cladding layer 102, a non-doped quantum well active layer 103, a p-AlGaAs first cladding layer 104, a p-AlGaAs etching stop layer 105, a p-AlGaAs second cladding layer 106, a p-GaAs contact layer 107, an n-AlGaAs current blocking layer 108, and an n-GaAs protection layer 109 are deposited and grown in that order on the n-GaAs substrate 101 in a first crystal growth step.

The n-AlGaAs cladding layer 102 has a composition of n-$Al_{0.5}Ga_{0.5}As$, a carrier concentration of $1\times10^{18} cm^{-3}$, and a thickness of 1.0 µm. The non-doped quantum well active layer 103 is formed in a triple quantum well structure made of an $Al_{0.07}Ga_{0.93}As$ well layer (65 Å thickness), an $Al_{0.3}Ga_{0.7}As$ barrier layer (50 Å thickness), and a guide layer (550 Å thickness) of the same composition. The p-AlGaAs first cladding layer 104 has a composition of p-$Al_{0.5}Ga_{0.5}As$, a carrier concentration of $1\times10^{18} cm^{-3}$, and a thickness of 0.2 µm. The p-AlGaAs etching stop layer 105 has a composition of p-$Al_{0.20}Ga_{0.80}As$, a carrier concentration of $1\times10^{18} cm^{-3}$, and a thickness of 100 Å. The p-AlGaAs second cladding layer 106 has a composition of p-$Al_{0.5}Ga_{0.5}As$, a carrier concentration of $1\times10^{18} cm^{-3}$, and a thickness of 1 µm. The p-GaAs contact layer 107 has a carrier concentration of $1\times10^{19} cm^{-3}$ and a thickness of 0.3 µm. The n-AlGaAs current blocking layer 108 has the composition of n-$Al_{0.5}Ga_{0.5}As$, a carrier concentration of $1\times10^{18} cm^{-3}$, and a thickness of 0.1 µm. The n-GaAs protection layer 109 has a carrier concentration of $1\times10^{18} cm^{-3}$ and a thickness of 0.4 µm.

Figure 1B:
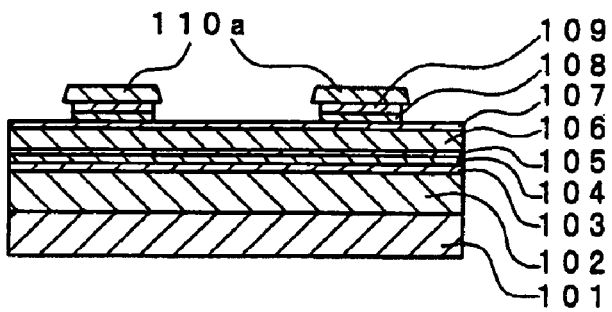

Next, the n-GaAs substrate 101 on which the above semiconductor layers are formed is removed from the growth apparatus, and using a photolithographic method well known in the art, a stripe-shaped $SiO_2$ mask 110a is formed on the n-GaAs protection layer 109 as shown in FIG. 1B. This $SiO_2$ mask serves as an etching mask, and a well known selective etching method is employed to etch the n-AlGaAs current blocking layer 108 and the n-GaAs protection layer 109 down to the p-GaAs contact layer 107.

Figure 1C:
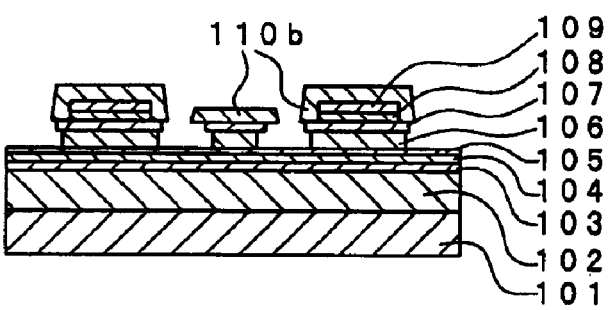

Then, as shown in FIG. 1C, a well known photolithography method is used to form a striped $SiO_2$ mask 110b on the p-GaAs contact layer 107. The $SiO_2$ mask 110b serves as an etching mask, and using a well known selective etching method, the p-AlGaAs second cladding layer 106 and the p-GaAs contact layer 107 are processed into a ridge shape down to the p-AlGaAs etching stop layer 105.

In the first embodiment, hydrofluoric acid is used as the selective etchant for the AlGaAs layers, and a solution of hydrogen peroxide added to ammonia water is used as the selective etchant for the GaAs layers. The width at the bottom portion of the ridge (stripe width) is 1 to 4 µm.

Figure 1D:
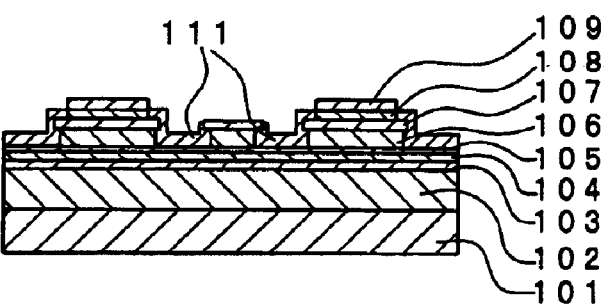
Figure 1E:
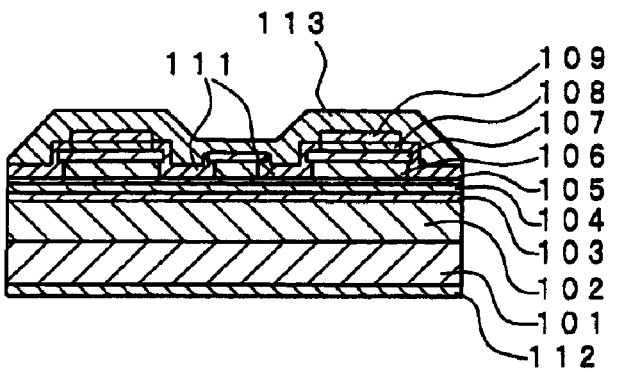

This is followed by the use of a well known photolithography method to form a $SiO_2$ insulation film 111 (0.1 to 0.3 µm thickness) on the side surfaces of the ridge portion as shown in FIG. 1D. Next, as shown in FIG. 1E, a p-side ohmic electrode 113 is formed on the top surface on the p-GaAs contact layer 107 side and an n-side ohmic electrode 112 is formed on the bottom surface of the n-GaAs substrate 101. Lastly, using a cleavage method, the resonator length is adjusted to 200 µm, and a coating film with 30% reflectance is formed on the emission side end surface and a coating film with 50% reflectance is formed on the opposite side end surface (coating films are not shown).

The ridge-type semiconductor laser was fabricated through the above processes, and its emission wavelength was measured to be 800 nm.

With the conventionally structured ridge-type semiconductor laser shown in FIG. 1D, the assembly yield is 10% or less, with most of the defects being laser oscillation failure, when it is assembled onto a SiC sub-mount with the p-side ohmic contact electrode 13 serving as the bonding surface. Analysis of the defects showed that in most of the chips there were cracks at or near the bottom portion of the ridge. The cracks likely are caused due to stress during assembly being concentrated at the ridge portion, which is the only protruding portion. Cracks also are thought to occur for the same reason during the cleavage process, and it is possible that the ridge portion is severely damaged in both processes. Also, even with the elements that did emit laser light, the majority were found to have problems such as an increased current threshold value or very conspicuous deterioration at elevated temperatures (in a lifetime test at 70° C., 5 mW, the change in operating current after 100 hours was 10% or more). It is believed that the primary reason for this is diminished heat dissipation properties of the element due to most of the surface of the conventionally structured element being covered by a high thermal resistance $SiO_2$ film.

On the other hand, the result for the ridge-type semiconductor laser of the first embodiment was an assembly yield of 95% or more, with very few defects due to failure of the laser to oscillate, when the laser was similarly assembled onto a SiC sub-mount with the p-side ohmic electrode 113 serving as the bonding surface. This is likely due to the alleviation of stress to the central ridge portion A, because the stress during assembly is concentrated to the other ridge portions (lateral ridge portions B shown in FIG. 2A), which are higher than the ridge portion where the current is confined (the central ridge portion A shown in FIG. 2A). The same applies to the cleavage process, where the defects during production such as, for example, cracking or the like are considerably reduced because stress concentrated at the central ridge portion A is alleviated by the surrounding lateral ridge portions B.

Also, superior results were obtained, with a 25% drop in the threshold current (20 mA→15 mA) of the element compared to the conventional structure and 90% or more of the elements after assembly showing a 10% or less change in operating current after 1000 hours in a high temperature lifetime test (70° C., 5 mW). This is presumably because there was a significant improvement in the heat dissipation properties of the element, because the ridge-type semiconductor laser of the first embodiment does not have a low thermal conductivity $SiO_2$ film formed on the n-AlGaAs current blocking layer 108, and it is connected to the sub-mount via a high thermal conductivity metal electrode. Although the heat resistance value of the element is dependent on the film thickness and the area of the various layers, the thermal conductivity with an AlGaAs layer, although the difference varies with the Al composition, is about 10 W/m/K, which is approximately one order of magnitude higher than that with a $SiO_2$ film, which is about 1 W/m/K. Because the film thickness of the n-AlGaAs current blocking layer 108 (0.5 to 0.7 µm) in the ridge-type semiconductor laser according to the first embodiment is on the same order as the $SiO_2$ film thickness (0.1 to 0.3 µm), the heat resistance value of the element is presumably smaller with the ridge-type semiconductor laser of the first embodiment.

Figure 2A:
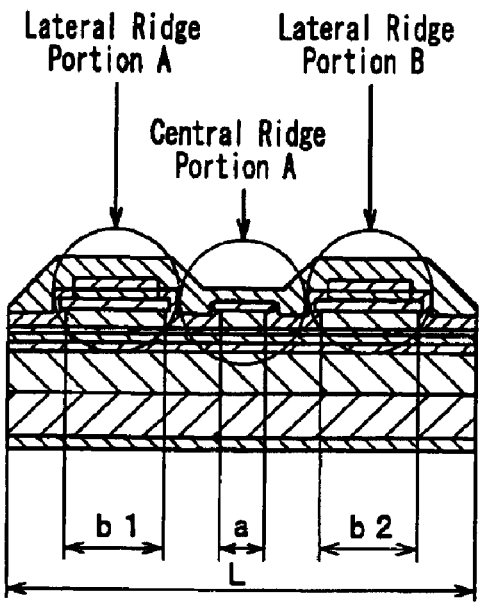
FIGS. 2A to 2C are cross-sectional views showing a magnification of the ridge portion of the ridge-type semiconductor laser of FIG. 1E.
Figure 2B:
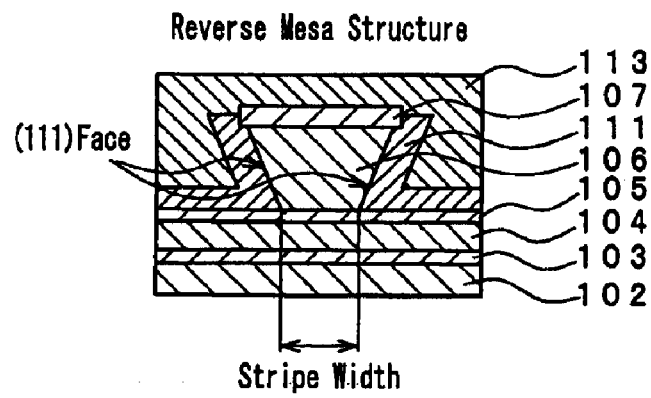

Another method for lowering the heat resistance value of the element is to give the central ridge portion A a reverse mesa shape, as shown in FIG. 2B. The $SiO_2$ film 111 is not formed on the central ridge portion A for the purpose of forming a contact with the electrode, so that with the conventionally structured element (FIG. 11D), where most of the element surface is covered by a dielectric film, the central ridge portion is an essential heat dissipation route and the area of the ridge top that forms a junction with the electrode greatly influences the heat dissipation properties of the element. Adopting a reverse mesa structure makes it possible to expand the area of the ridge top without changing the stripe width (bottom portion dimensions of the central ridge portion A), which influences the properties of the element, and thus this approach is effective in improving the heat dissipation properties.

To further increase the heat dissipation properties, it is preferable that the lateral ridge portions B have the widest area possible and that they are close to the central ridge portion. On the other hand, giving consideration to stabilizing the ridge portion formation process, a wide etching region must be secured in order to confirm the end point of the etching. Consequently, as shown in FIG. 2A, when the width of the central ridge portion is a, the width of the lateral ridge portions is b1, b2, . . . for a total of h (b=b1+b2+ . . . ), and the repetition width between central ridge portions is L, then it is preferable that (a+h)/L is 0.5 or less.

Figure 2C:
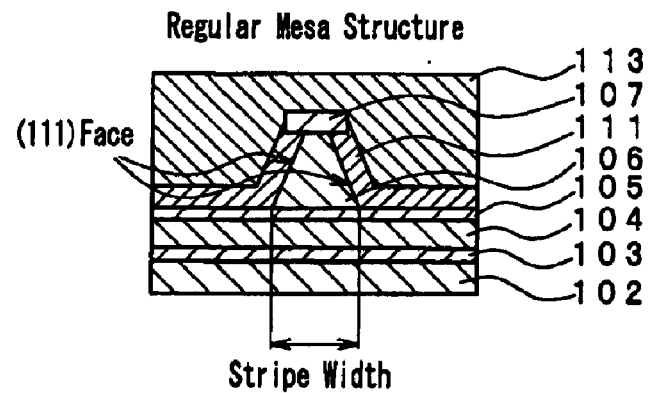

With the present embodiment, it is possible to use a hydrofluoric acid based anistropic etchant to etch the AlGaAs layer formed on the GaAs substrate, for which the (100) face is the primary face, in a stripe-shape in the <011> direction to obtain a ridge portion with the regular mesa structure shown in FIG. 2C, or in the stripe direction rotated 90° to obtain a ridge portion with the reverse mesa structure. The speed at which the hydrofluoric acid based etchant etches the (111) crystal face is small enough compared to that for the (100) face that the side surface of the ridge portion is formed at the (111) crystal face. A geometric calculation shows that the area of the top of the central ridge portion A of a reverse mesa structure is approximately 2 to 3 times that of a regular mesa structure (if ridge height=1.0 $\mu$m, stripe width=3 to 5 $\mu$m). Thus, with a reverse mesa structure it is possible to achieve a considerable improvement in heat dissipation properties.

Furthermore, adopting a reverse mesa ridge structure increases the contact area with the electrode for the same reason as above, thus reducing the contact resistance. One resulting advantage of this is that the series resistance of the element can be reduced.

The first embodiment has been described with regard to a case where the semiconductor laser element is adopted for a low-output semiconductor laser element used to read out CDs or the like, but the present invention likewise can be adopted for a high-output semiconductor laser element used to read/write CD-R/RW disks, for example. In this case as well, it is possible to achieve stabilized element properties through the reduction of stress to the central ridge portion during assembly, reduced cracking during the cleavage process, and improved element properties at elevated temperatures through the increase in heat dissipation properties.

Moreover, the element of the present embodiment may be made to further suppress the deterioration at the end surface that accompanies the increasing of the element output, by adopting a window structure that is obtained by high concentration doping through dispersion or ion implantation of a dopant such as Zn into the active layer near the end surface, and forming a current blocking layer near that end surface in order to inhibit carrier implantation into the active layer.

The present invention can be adopted for a self-oscillating semiconductor laser element, in which case a p-Al$_{0.07}$Ga$_{0.93}$As layer (carrier concentration 1×10$^{18}$cm$^{-3}$, 100 Å thickness) can be used as the etching stop layer 105 in the above structure so that the etching stop layer serves as a saturable absorption layer.

Figure 11A:
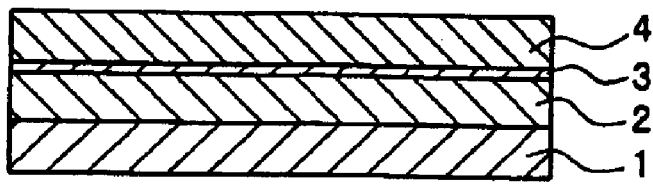
FIGS. 11A to 11D are cross-sectional views showing the manufacturing method of a conventional ridge-type semiconductor laser.
Figure 11B:
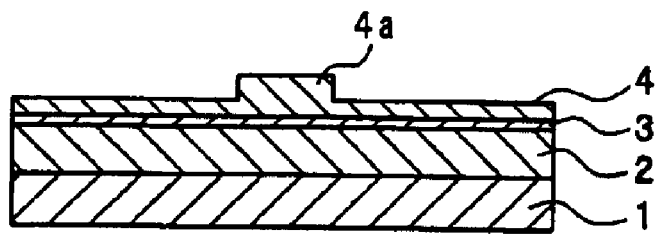
Figure 11C:
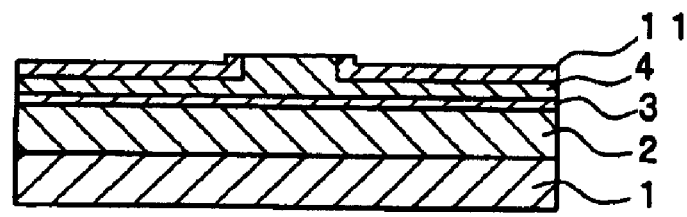
Figure 11D:
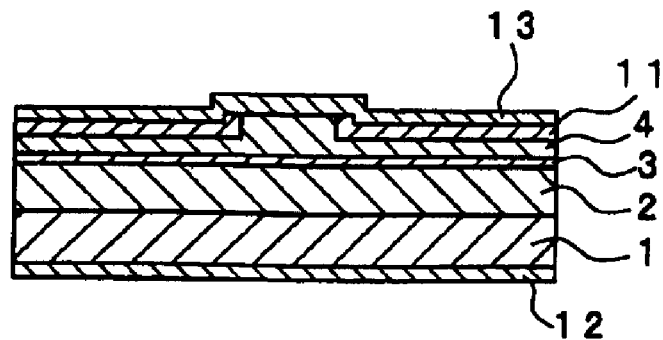
Figure 12A:
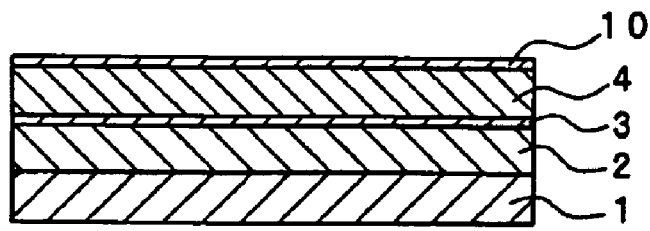
FIGS. 12A to 12D are cross-sectional views showing the manufacturing method of another conventional ridge-type semiconductor laser.
Figure 12B:
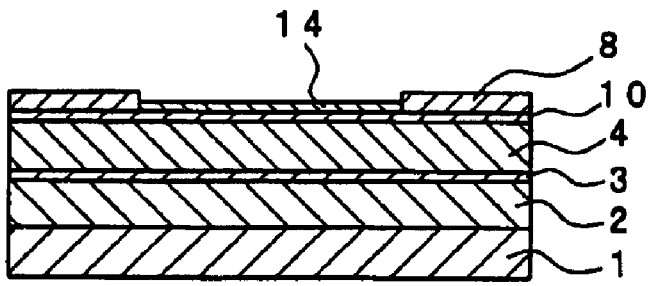
Figure 12C:
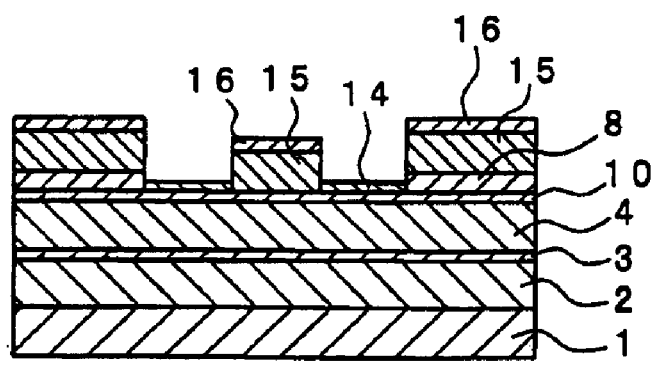
Figure 12D:
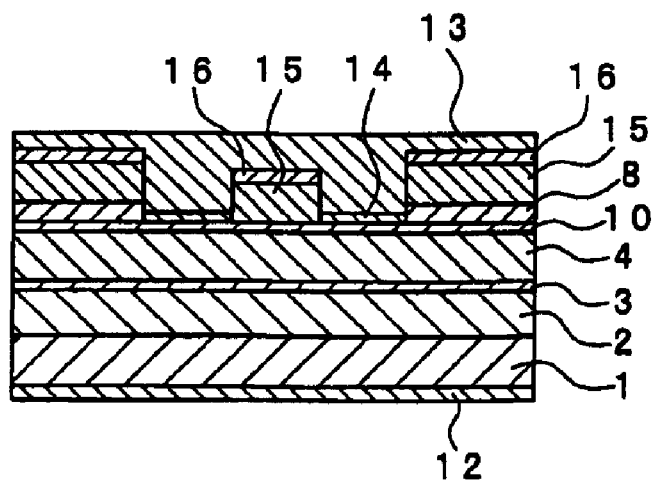
Figure 13:
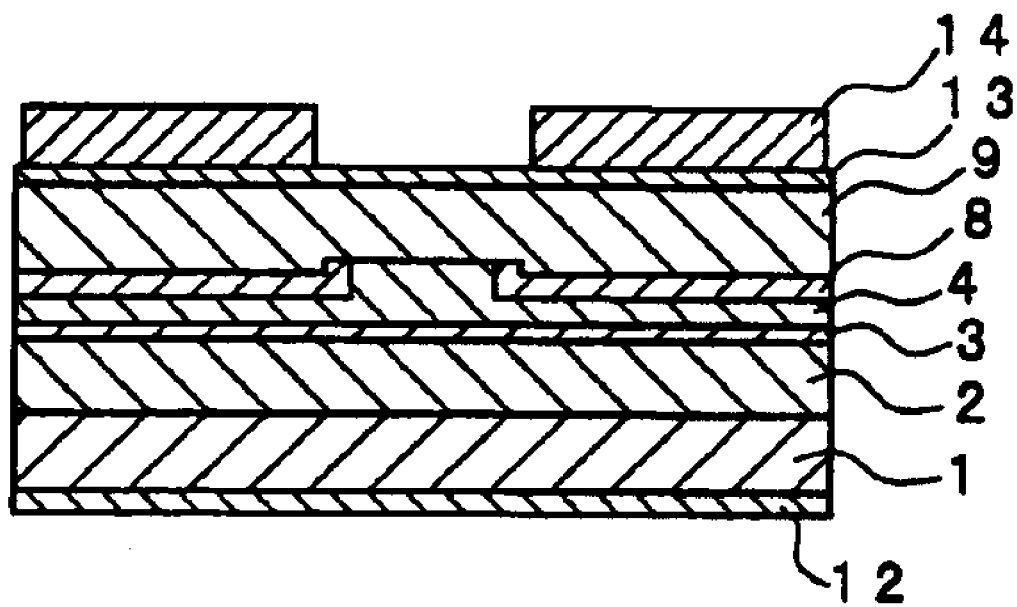
FIG. 13 is a cross-sectional view showing another conventional ridge-type semiconductor laser.
Figure 14A:
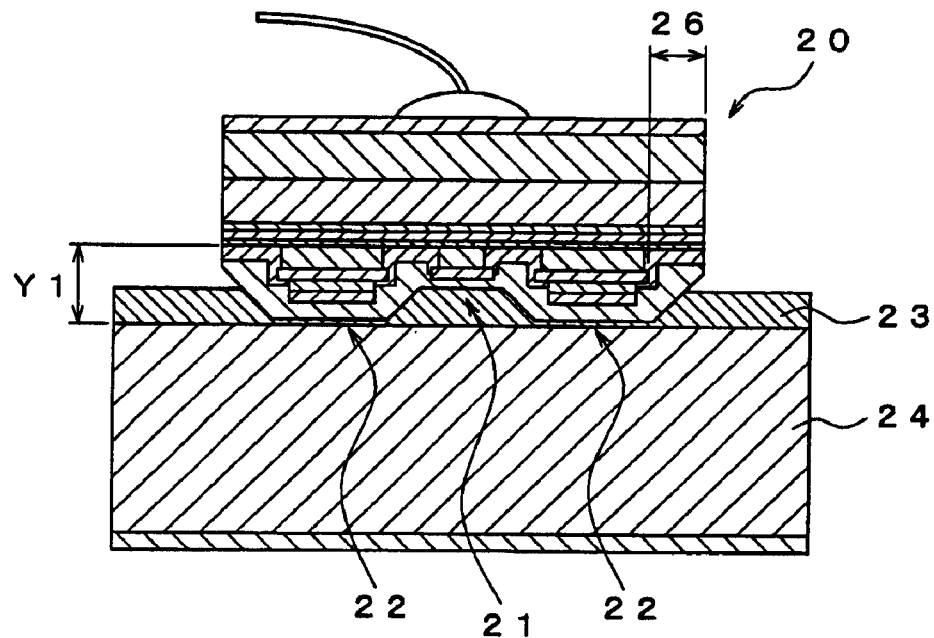
FIGS. 14A and 14B are cross-sectional views for describing the effect attained by the ridge-type semiconductor laser of the present invention.
Figure 14B:
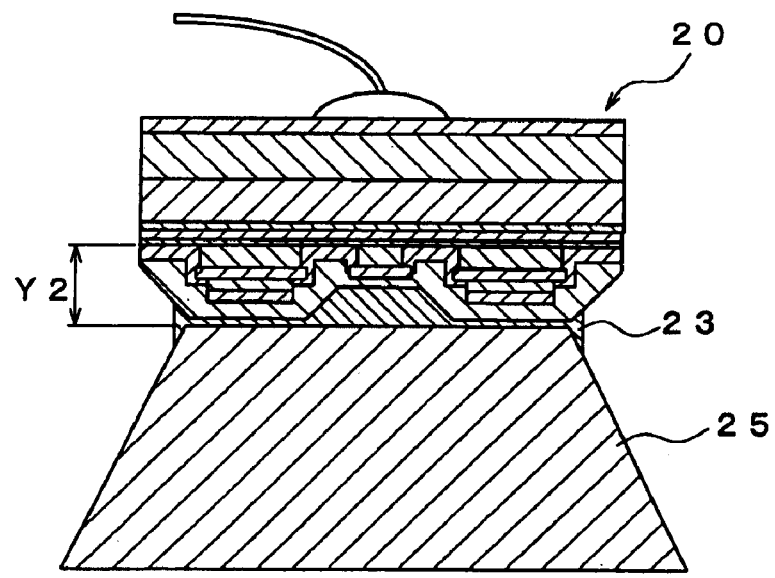

Also, with the conventional structure shown in FIG. 11D, the p-GaAs contact layer is the final layer that is grown, but this causes the phenomenon of the Zn dopants being made inactive by atomic hydrogen (Akazaki Isamu, editor, "III–V Compound Semiconductors" Baifukan, pp. 312–313), which leads to the problem of increased element resistance. In response, with the structure of the present invention shown in FIG. 1E, an n-type semiconductor layer is grown on top of the p-GaAs contact layer 107, which has the benefit of inhibiting hydrogen-induced inactivation. This effect is particularly noticeable in the case of AlGaInP-based red semiconductor lasers.

Second Embodiment

In the second embodiment, the current blocking layer is formed not by the n-AlGaAs layer 108, as was the case in the first embodiment, but instead by providing the GaAs layer and the AlGaAs layer with high resistance through ion implantation. Aside from this, the second embodiment has the same configuration as that of the first embodiment.

Figure 3A:
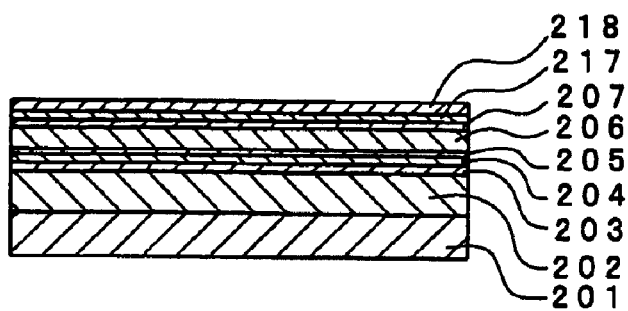
FIGS. 3A to 3E are cross-sectional views showing the structure and the manufacturing method of the ridge-type semiconductor laser according to a second embodiment of the present invention.

The structure and the manufacturing process of the semiconductor laser element according to the present embodiment are described with reference to FIGS. 3A to 3E. First, an n-GaAs substrate 201 is set inside a crystal growth apparatus (not shown), and as shown in FIG. 3A, an n-AlGaAs cladding layer 202, a non-doped quantum well active layer 203, a p-AlGaAs first cladding layer 204, a p-AlGaAs etching stop layer 205, a p-AlGaAs second cladding layer 206, a p-GaAs contact layer 207, a p-AlGaAs third cladding layer 217, and a p-GaAs protection layer 218 are deposited and grown in that order on the n-GaAs substrate 201 in a first crystal growth step.

The n-AlGaAs cladding layer 202 has a composition of n-Al$_{0.5}$Ga$_{0.5}$As, a carrier concentration of 1×10$^{18}$cm$^{-3}$, and a thickness of 1.0 $\mu$m. The p-AlGaAs first cladding layer 204 has a composition of p-Al$_{0.5}$Ga$_{0.5}$As, a carrier concentration of 1×10$^{18}$cm$^{-3}$, and a thickness of 0.2 $\mu$m. The p-AlGaAs etching stop layer 205 has a composition of p-Al$_{0.08}$Ga$_{0.92}$As, a carrier concentration of 1×10$^{18}$cm$^{-3}$, and a thickness of 100 Å. The p-AlGaAs second cladding layer 206 has a composition of p-Al$_{0.5}$Ga$_{0.5}$As, a carrier concentration of 1×10$^{18}$cm$^{-3}$, and a thickness of 1 $\mu$m. The p-GaAs contact layer 207 has a carrier concentration of 1×10$^{19}$cm$^{-3}$ and a thickness of 0.3 $\mu$m. The p-AlGaAs third cladding layer 217 has a composition of p-Al$_{0.5}$Ga$_{0.5}$As, a carrier concentration of 1×10$^{18}$cm$^{3}$, and a thickness of 0.7 $\mu$m. The p-GaAs protection layer 218 has a carrier concentration of 1×10$^{18}$cm$^{-3}$ and a thickness of 0.1 $\mu$m.

The configuration of the non-doped quantum well active layer 203 and the band gap of the p-AlGaAs etching stop layer 205, which serves as a saturable absorption layer, are identical to those of the first embodiment.

Figure 3B:
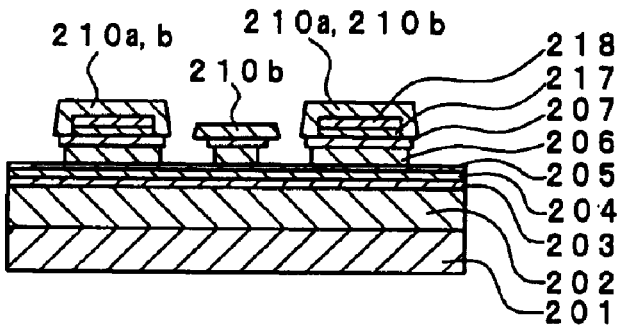

Next, the n-GaAs substrate 201 on which the above semiconductor layers are formed is removed from the growth device, and using a photolithographic method well known in the art, a stripe-shaped SiO$_2$ mask 210a is formed on the p-GaAs protection layer 218, as shown in FIG. 3B. This SiO$_2$ mask 210a serves as an etching mask, and a selective etching method well known in the art is employed to etch the p-AlGaAs third cladding layer 217 and the p-GaAs protection layer 218 until reaching the p-GaAs contact layer 207.

Then, a well known photolithography method is used to form a striped SiO$_2$ mask 210b on the p-GaAs contact layer 207. The SiO$_2$ mask 210b serves as an etching mask, and a well known selective etching method is used to etch the p-AlGaAs second cladding layer 206 and the p-GaAs contact layer 207 down to the p-AlGaAs etching stop layer 205 and process them into a ridge shape.

The same selective etchant as that used in the first embodiment is used in the second embodiment as well. Also, the width of the ridge bottom portion (stripe width) is 1 to 4 μm.

Figure 3C:
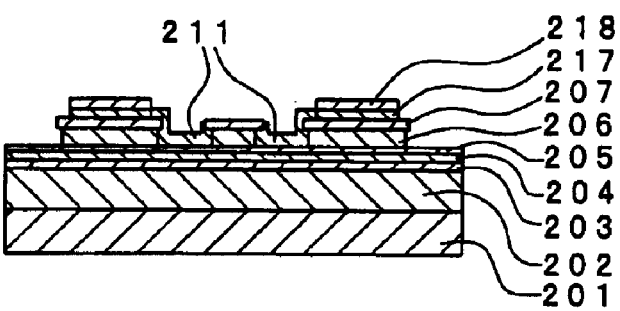
Figure 3D:
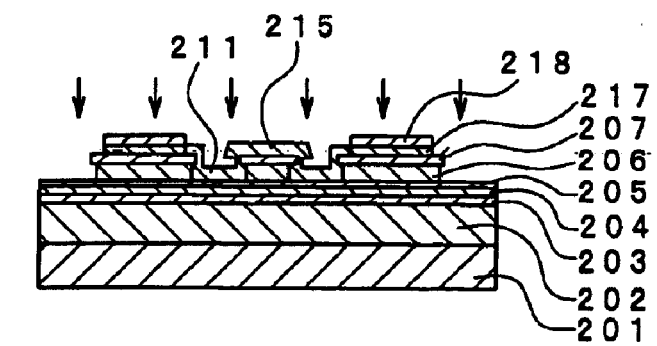
Figure 3E:
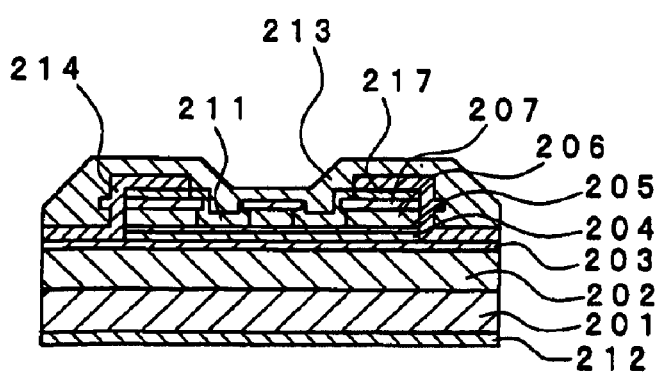

Next, as shown in FIG. 3C, a photolithography method well known in the art is used to form a SiO₂ insulation film 211 (0.1 to 0.3 μm thick) on the side surfaces of the central ridge portion in the center. Then, as shown in FIG. 3D, the p-GaAs contact layer 207 and the SiO₂ insulation film 211 are covered by an ion implantation mask 215 made of a thick film resist (2 μm or more thick), and the p-GaAs protection layer 218 and the p-AlGaAs third cladding layer 217, which are not covered by the thick film resist 215, are provided with high resistance through ion implantation to form the high resistance layer 214 shown in FIG. 3E. After the ion implantation mask 215 is removed, ohmic electrodes 213 and 212 are formed on the top surface on the p-GaAs contact layer 207 side and the bottom surface of the n-GaAs substrate 201, respectively, as shown in FIG. 3E. Lastly, using a cleavage method, the resonator length is adjusted to 200 μm, and a coating film with 30% reflectance is formed on the emission side end surface and a coating film with 50% reflectance is formed on the opposite side end surface.

The ridge-type semiconductor laser of the second embodiment was fabricated through the above process steps, and like in the first embodiment, its emission wavelength was measured to be 800 nm.

The result with the ridge-type semiconductor laser of the second embodiment was that as in the first embodiment, the assembly yield was 95% or more, with very few defects due to failure of the laser to oscillate, when the laser was assembled onto a SiC sub-mount with its p-side ohmic electrode 113 serving as the bonding surface. With the present embodiment, the current blocking layer may be made thinner than in the first embodiment because ion implantation is used to carry out current confinement. Consequently, because the distance from the active layer to the surface in the lateral ridge portions on both sides of the central ridge portion can be made small (the total film thickness can be set thin), there is the benefit that the heat dissipation properties can be further increased, even if the surface area of the lateral ridge portions is the same as that in the first embodiment.

Figure 4A:
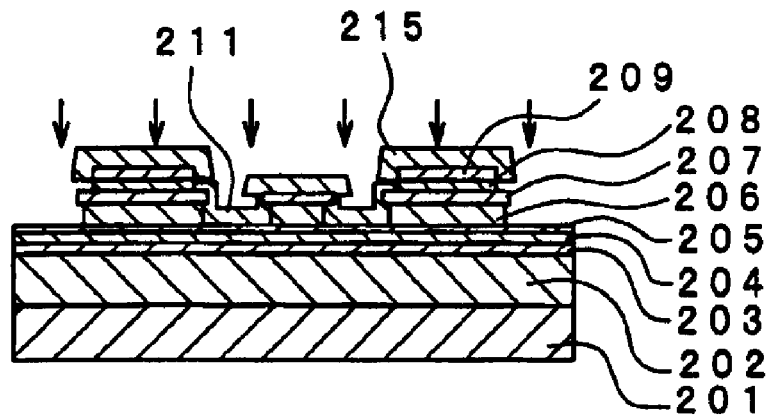
FIGS. 4A and 4B are cross-sectional views showing an applied example of the ridge-type semiconductor laser according to the second embodiment.
Figure 4B:
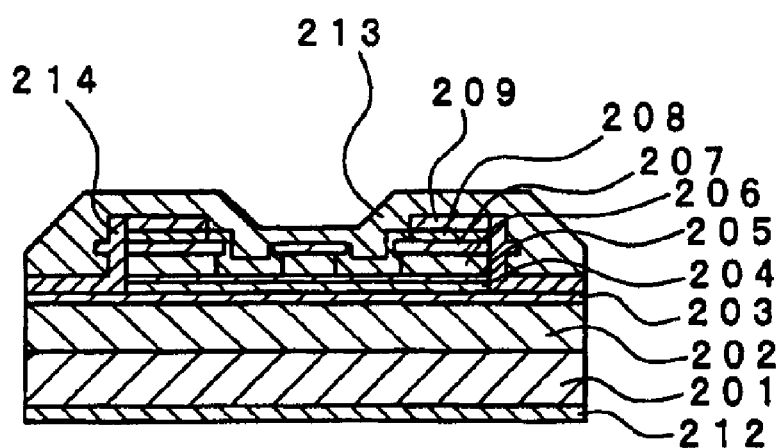

As an application example for the present embodiment, it is possible to adopt the configuration shown in FIGS. 4A and 4B. Here, the n-AlGaAs current blocking layer 208 and the n-GaAs protection layer 209 are formed, and the lateral ridge portions serve as current blocks due to the n-type semiconductor layers. The regions where the p-type semiconductor layers are exposed, other than between the central ridge portion and the lateral ridge portions, are provided with high resistance through ion implantation as shown in FIG. 4A, so as to form the high resistance layer 214, as shown in FIG. 4B, and thereby achieve current blocking. Thus, in the configuration of the first embodiment, there is a reduction in the surface area covered by the SiO₂ insulation film 111, which has a low thermal conductivity, and the heat dissipation properties are improved further. The above configuration simultaneously also achieves a reduction in stress at the ridge portion during assembly, and thus a laser with stable properties can be fabricated at low cost.

Third Embodiment

The third embodiment adopts the same basic configuration as the first or second embodiments, except that the GaAs and AlGaAs layers are given high resistance by ion implantation in order to confine the current at the central ridge portion. Apart from this, it has the same configuration as the first and second embodiments.

The structure and the manufacturing process of a first example of the semiconductor laser element according to the present embodiment are described with reference to FIGS. 5A1 and 5A2. Like in the first embodiment, the n-GaAs substrate 101 is set inside a crystal growth apparatus (not shown), a first crystal growth step is performed, and then the processing steps up to FIG. 1B are performed.

Next, a well known photolithography method is used to form an ion implantation mask 315 made of a stripe-shaped thick film resist (at a thickness of 2 μm or more) over the p-GaAs contact layer 107 as shown in FIG. 5A1. Then, the p-GaAs contact layer 107 that is not covered by the ion implantation mask and the p-AlGaAs second cladding layer 106, are provided with high resistance by ion implantation so as to form a high resistance layer 314a as shown in FIG. 5A2. Once the resist 315 has been removed, ohmic electrodes 313 and 312 are formed on the top surface on the p-GaAs contact layer 107 side and on the bottom surface of the n-GaAs substrate 101, respectively, as shown in FIG. 5A2. The resonator length is then adjusted to 200 μm by a cleavage method, and a coating film with 30% reflectance is formed on the emission side end surface and a coating film with 50% reflectance is formed on the opposite side end surface.

The ridge-type semiconductor laser of the third embodiment was fabricated through the above process steps, and like in the first embodiment, its emission wavelength was measured to be 800 nm.

The same selective etchant as that used in the first embodiment is used in the third embodiment as well. Also, the width of the ridge bottom portion (stripe width) is 1 to 4 μm.

The result with the ridge-type semiconductor laser of the third embodiment was that, like in the first embodiment, the assembly yield was 95% or more, and there were extremely few defects due to failure of the laser to oscillate, when the laser was assembled onto a SiC sub-mount with its p-side ohmic electrode 313 serving as the bonding surface. With the present embodiment, the current blocking layer may be made thinner than in the first embodiment because ion implantation is used to perform current confinement, and the distance from the active layer to the surface in the lateral ridge portions can be made small (the total film thickness is set thin), so that there is the benefit that the heat dissipation properties can be increased further, even if the surface area of the lateral ridge portions is the same as that in first embodiment.

As another example of an application for the present embodiment, FIGS. 5B1 and 5B2 show a configuration in which the current block of the lateral ridge portions is achieved by providing the semiconductor layers with high resistance through ion implantation. In the same way as in the second embodiment, each of the layers is deposited as shown in FIG. 3A and the p-AlGaAs third cladding layer 217 and the p-GaAs protection layer 218 are etched to form the lateral ridge portions as shown in FIG. 5B1. Then, ion implantation is performed through an ion implantation mask 316 made of a thick film resist in order to provide the p-GaAs contact layer 207, the p-AlGaAs second cladding layer 206, the p-AlGaAs third cladding layer 217, and the p-GaAs protection layer 218 with high resistance and form a high resistance layer 314b as shown in FIG. 5B2.

In this case, the lateral ridge portions can be p-type semiconductor layers, but by forming an n-type semiconductor layer or an undoped semiconductor layer of approximately 0.3 μm or more on the p-type semiconductor layers, it is possible to reduce element resistance by increasing Zn activation as mentioned above.

This configuration has the problem of being unstable in lateral modes because the stripe portion also confines the current due to ion implantation, however, it can be adopted for a gain guide laser.

Fourth Embodiment

In the fourth embodiment, a burying crystal growth step is added to the configuration of the first and second embodiments. This configuration is not suited for reducing costs because a plurality of crystal growth steps are performed. However, it does achieve the effects of reducing the concentration of stress at the ridge portion during assembly, improving the heat dissipation properties, reducing cracks during cleavage, and reducing element resistance. Aside from the addition of a burying growth step, this embodiment has the same configuration as that of the first and second embodiments.

The structure and the manufacturing process of the semiconductor laser element according to the present embodiment are described with reference to FIGS. 6A1 and 6A2. Like in the first embodiment, a photolithography method and a selective etching method well known in the art are used to perform the processing steps up to FIG. 1D to obtain the state shown in FIG. 6A1, where the ridges and the $SiO_2$ insulation film 111 (0.1 to 0.3 $\mu$m thickness) are formed. The same selective etchant as that used in the first embodiment is used in the fourth embodiment as well, and the width of the ridge bottom portion (stripe width) is 1 to 4 $\mu$m.

Then, as shown in FIG. 6A2, a p-GaAs burying layer 416 is formed. Lastly, ohmic electrodes 413 and 412 are formed on the top surface on the p-GaAs burying layer 416 side and on the bottom surface of the n-GaAs substrate 101, respectively.

In the configuration shown in FIGS. 6B1 and 6B2, current confinement is performed by an n-type current blocking layer 408 (AlGaAs or GaAs) instead of the $SiO_2$ insulation film 111 in the configuration shown in FIGS. 6A1 and 6A2. As shown in FIG. 6B1, the n-type current blocking layer 408 is formed by a selective growth step in which an $SiO_2$ mask 410 is used as the etching mask during ridge formation. The fabrication steps thereafter are the same as in FIGS. 6A1 and 6A2, and as shown in FIG. 6B2, the p-GaAs burying layer 416 and the ohmic electrodes 413 and 412 are formed.

The configuration shown in FIG. 6C is the configuration in FIGS. 6B1 and 6B2 without the p-GaAs burying layer 416 being formed but with the ohmic electrodes 413 and 412 formed on the top surface of the n-type current blocking layer 408 and on the bottom surface of the n-GaAs substrate 101, respectively.

In the configurations shown in FIGS. 6B1, 6B2, and 6C, it is not absolutely necessary that the n-type semiconductor layer of the lateral ridge portions is formed. There is less of a difference in height between the central ridge portion and the lateral ridge portions in a configuration without the n-type semiconductor layer, and therefore there is a risk that the effect of reducing stress concentrated at the central ridge portion during assembly may be lessened. However, this can be overcome by choosing an appropriate thickness for the n-type current blocking layer.

Fifth Embodiment

Figure 7:
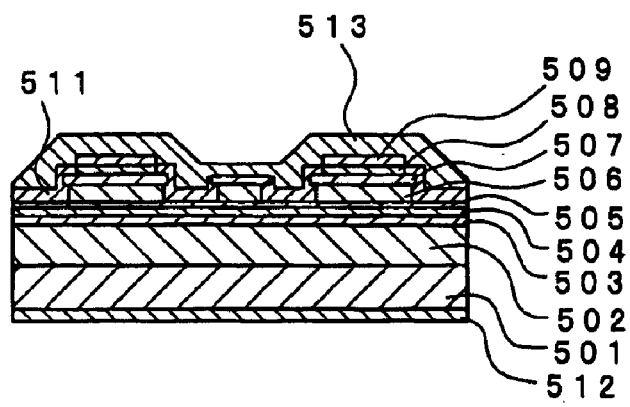
FIG. 7 is a cross-sectional view of the ridge-type semiconductor laser according to a fifth embodiment of the present invention.

FIG. 7 shows the semiconductor laser element according to the fifth embodiment. The fifth embodiment is an example in which the present invention is adopted for a ridge-type semiconductor laser element that employs an AlGaInP-based material.

The structure and the manufacturing process of the present semiconductor laser element are described with reference to FIG. 7. First, an n-GaAs substrate 501 is set inside a crystal growth apparatus (not shown), and an n-AlGaInP cladding layer 502, a non-doped quantum well active layer 503, a p-AlGaInP first cladding layer 504, a p-GaInP etching stop layer 105, a p-AlGaInP second cladding layer 506, a p-GaAs contact layer 507, an n-AlGaAs current blocking layer 508, and an n-GaAs protection layer 509 are deposited and grown in that order on the n-GaAs substrate 501 in a first crystal growth step.

The n-AlGaInP cladding layer 502 has a composition of n-$(Al_{0.7}Ga_{0.3})_{0.5}In_{0.5}P$, a carrier concentration of $1\times10^{18}$ cm$^{-3}$, and a thickness of 1.2 $\mu$m. The non-doped quantum well active layer 503 is formed in a strained quadruple quantum well structure made of a $Ga_{0.6}In_{0.4}P$ well layer (53 Å thickness), an $(Al_{0.5}Ga_{0.5})_{0.5}In_{0.5}P$ barrier layer (50 Å thickness), and a guide layer (400 Å thickness) of the same composition. The p-AlGaInP first cladding layer 504 has a composition of p-$(Al_{0.7}Ga_{0.3})_{0.5}In_{0.5}P$, a carrier concentration of $4\times10^{17}$cm$^3$, and a thickness of 0.3 $\mu$m. The p-GaInP etching stop layer 505 has a composition of p-$Ga_{0.5}In_{0.5}P$, a carrier concentration of $1\times10^{18}$cm$^{-3}$, and a thickness of 90 Å. The p-AlGaInP second cladding layer 506 has a composition of p-$(Al_{0.7}Ga_{0.3})_{0.5}In_{0.5}P$, a carrier concentration of $1\times10^{18}$cm$^{-3}$, and a thickness of 1 $\mu$m. The p-GaAs contact layer 507 has a carrier concentration of $1\times10^{19}$cm$^{-3}$ and a thickness of 0.2 $\mu$m. The n-AlGaAs current blocking layer 508 has a composition of n-$Al_{0.5}Ga_{0.5}As$, a carrier concentration of $1\times10^{8}$cm$^{-3}$, and a thickness of 0.1 $\mu$m. The n-GaAs protection layer 509 has a carrier concentration of $1\times10^{18}$cm$^{-3}$ and a thickness of 0.4 $\mu$m.

Next, the n-GaAs substrate 501 on which the above semiconductor layers are formed is removed from the growth apparatus, and using a photolithographic method well known in the art, a stripe-shaped $SiO_2$ mask is formed on the n-GaAs protection layer 509. This $SiO_2$ mask serves as an etching mask, and a well known selective etching method is used to etch the n-AlGaAs current blocking layer 508 and the n-GaAs protection layer 509 down to the p-GaAs contact layer 507.

Then, a photolithography technique well known in the art is used to form a striped $SiO_2$ mask on the p-GaAs contact layer 507. This $SiO_2$ mask serves as an etching mask, and a selective etching method well known in the art is used to etch the p-AlGaInP second cladding layer 506 and the p-GaAs contact layer 507 until reaching the p-GaInP etching stop 505 and process them into a ridge shape.

In the fifth embodiment, a hydrofluoric acid based-etchant is used as the selective etchant for the AlGaAs layers, a solution of hydrogen peroxide added to ammonia water is used as the selective etchant for the GaAs layers, and a hydrochloric acid based-etchant is used to etch the AlGaInP layers. Also, the width of the ridge bottom portion (stripe width) is 3 to 5 $\mu$m.

This is followed by the use of a well known photolithography method to form a $SiO_2$ insulation film 511 (thickness of 0.1 to 0.3 $\mu$m) on the side surface of the ridge portions. Lastly, ohmic electrodes 513 and 512 are formed on the top surface on the p-GaAs contact layer 507 side and on the bottom surface of the n-GaAs substrate 501, respectively, a cleavage method is used to adjust the resonator length to 350 $\mu$m, and a coating film with 30% reflectance is formed on the emission side end surface and a coating film with 75% reflectance is formed on the opposite side end surface.

The ridge-type semiconductor laser of the fifth embodiment was fabricated through the above process steps, and its emission wavelength was measured to be 660 nm.

Like in the first embodiment, the result with the ridge-type semiconductor laser of the fifth embodiment was that the assembly yield was 90% or more, and there were extremely few defects due to failure of the laser to oscillate, when the laser was assembled onto a SiC sub-mount with the p-side ohmic electrode serving as the bonding surface. This is likely due to the alleviation of stress at the central ridge portion, because the stress during assembly is concentrated at the lateral ridge portions, which are higher than the central ridge portion where current confinement is performed. The same applies to the cleavage process, where the defects during production such as, for example, cracking or the like are considerably reduced because stress concentrated at the central ridge portion is alleviated by the surrounding lateral ridge portions. Also, superior results were obtained, with a 20% drop in the threshold current (25 mA→20 mA) of the element compared to the conventional structure, and 90% or more of the elements after assembly showing a 10% or less change in operating current after 1000 hours in a high temperature lifetime test (70° C., 7 mW). This is presumably because there was a significant improvement in the heat dissipation properties of the element, because the ridge-type semiconductor laser of the fifth embodiment, like that of the first embodiment, does not have a $SiO_2$ film with low thermal conductivity formed on the n-type current blocking layer, and it is connected to the sub-mount via a metal electrode having high thermal conductivity.

As is the case with the first embodiment, in the fifth embodiment it is possible to form the central ridge portion in a reverse mesa shape, as shown in FIG. 2B, as one method to lower the heat resistance value of the element. With the present element, it is possible to use a hydrochloric acid-based anistropic etchant to etch the AlGaInP layer formed on the GaAs substrate, for which the (100) face is the primary face, in a stripe-shape in the <011> direction to obtain a regular mesa structure, or rotated 90° in the stripe direction to obtain a reverse mesa structure.

Adopting a reverse mesa structure ridge leads to an increase in the contact area with the electrode, with the benefit that the contact resistance can be reduced and thus the series resistance of the element can be reduced.

The fifth embodiment has been described with regard to a case where the semiconductor laser element is adopted for a low-output semiconductor laser element used to read DVDs or the like, but the present invention can be similarly adopted for a high-output semiconductor laser element used to read/write DVD-R/RW and RAM disks, for example. In this case as well, it is possible to achieve stabilized element properties through the reduction of stress at the central ridge portion during assembly, reduced cracking during the cleavage process, and improved element properties at elevated temperatures through the increase in heat dissipation properties.

In order to suppress the end surface deterioration that accompanies increasing the output of the element, the non-doped quantum well active layer 503 was given a strained triple quantum well structure made of a $Ga_{0.6}In_{0.4}P$ well layer (60 Å thickness), an $(Al_{0.5}Ga_{0.5})_{0.5}In_{0.5}P$ barrier layer (50 Å thickness), and a guide layer (250 Å thickness) of the same composition.

Moreover, this element can be made to suppress further the end surface deterioration that accompanies making the element high output, by adopting a window structure that is obtained by high concentration doping through dispersion or ion implantation of a dopant such as Zn into the active layer near the end surface, and forming a current blocking layer near the same end surface in order to inhibit carrier implantation into the active layer.

Also, in the conventional structure shown in FIG. 11D, the p-GaAs contact layer is the final crystal growth layer, and as mentioned above, this causes the phenomenon of the Zn dopants being made inactive by atomic hydrogen, which results in the problem of increased element resistance. However, with the structure of the present embodiment shown in FIG. 7, an n-type semiconductor layer is grown on the p-GaAs contact layer 507, and this has the benefit of inhibiting hydrogen-induced inactivity.

Sixth Embodiment

Figure 8A:
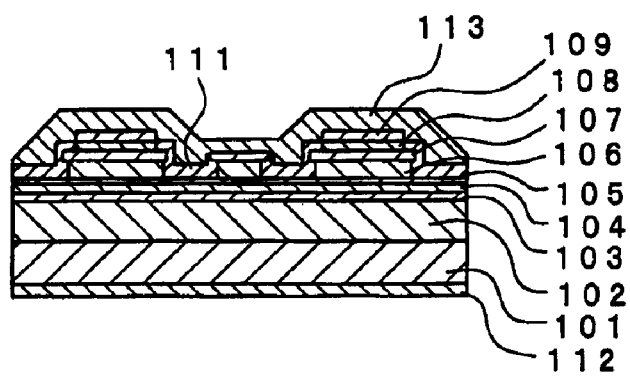
FIGS. 8A to 8C are cross-sectional views showing various different examples of the ridge-type semiconductor laser according to a sixth embodiment of the present invention.
Figure 8B:
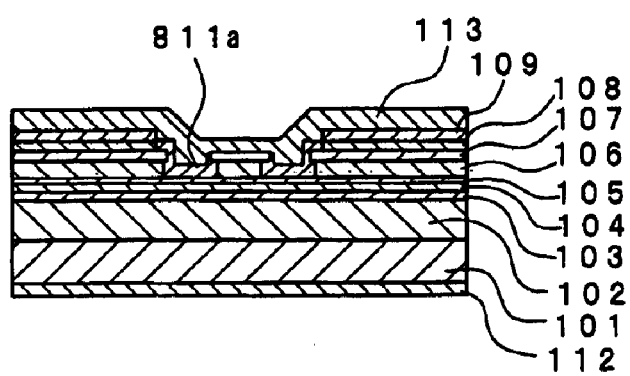
Figure 8C:
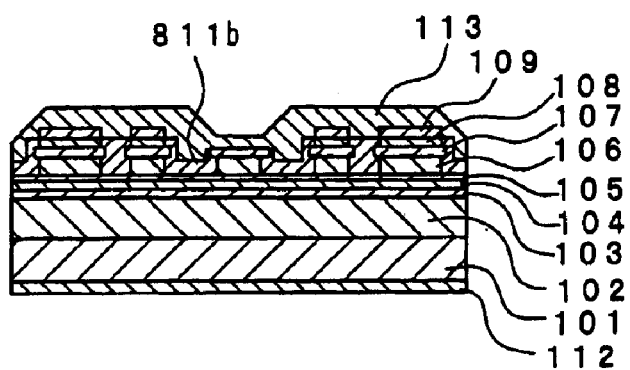
Figure 9A:
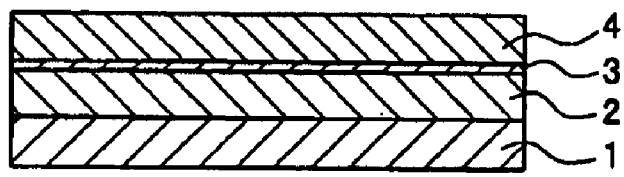
FIGS. 9A to 9E are cross-sectional views showing the manufacturing method of a conventional ridge-type semiconductor laser.
Figure 9B:
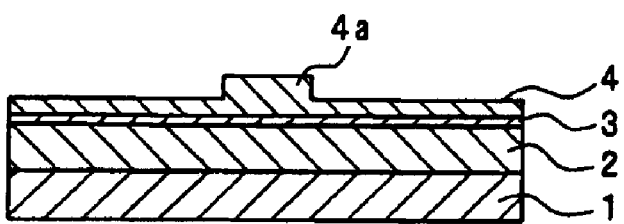
Figure 9C:
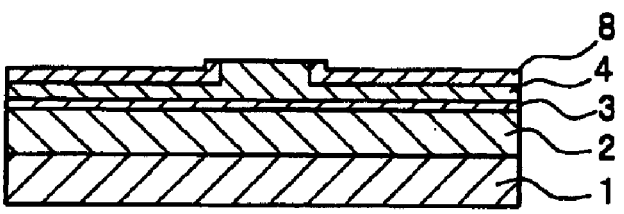
Figure 9D:
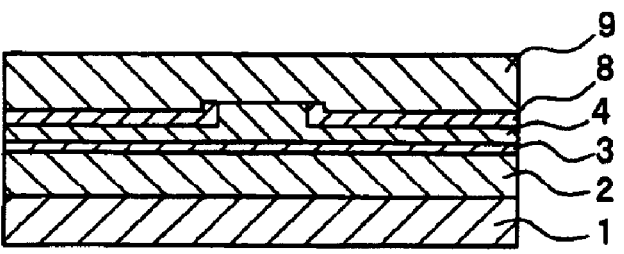
Figure 9E:
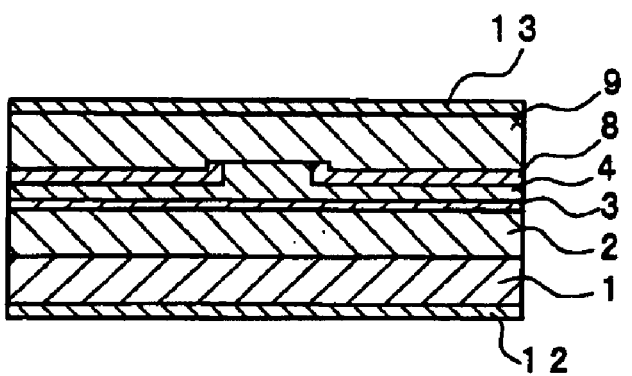
Figure 10A:
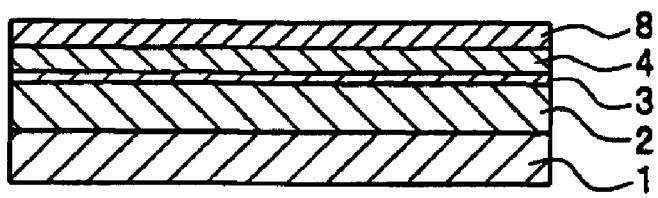
FIGS. 10A to 10D are cross-sectional view showing the manufacturing method of a conventional groove-type semiconductor laser.
Figure 10B:
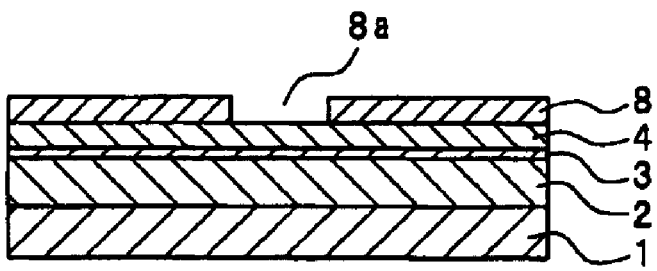
Figure 10C:
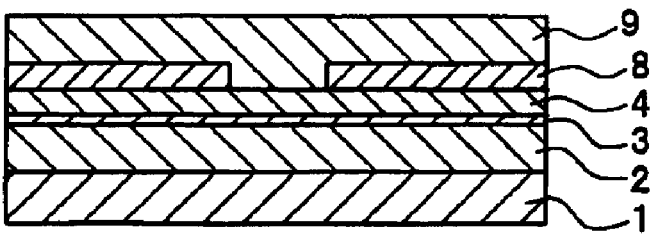
Figure 10D:
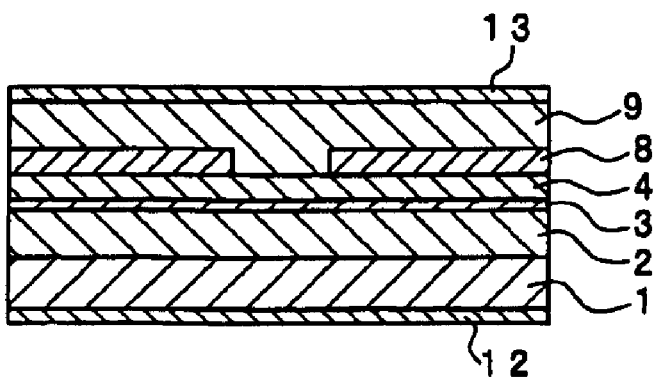

FIGS. 8A to 8C show the semiconductor laser element according to a sixth embodiment. The present embodiment relates to other examples of the configuration for the lateral ridge portions according to the first to fifth embodiments.

The configuration in FIG. 8A is identical to that of the first embodiment, where two lateral ridge portions are formed to either side of the central ridge portion and the outer side of the lateral ridge portions has been etched flat. In contrast, in the configuration shown in FIG. 8B, two lateral ridge portions are formed, but the outer side of the lateral ridge portions has not been etched. Consequently, an $SiO_2$ insulation film 811a is formed only between the central ridge portion and the lateral ridge portions. In the configuration shown in FIG. 8C, four lateral ridge portions are formed, and an $SiO_2$ insulation film 811b is formed between each of the ridge portions.

In any of these configurations, if at least two ridge portions are formed higher than the central ridge portion, then it is possible to achieve the effect of a reduction in stress during assembly. The heat dissipation properties can be increased by removing the insulation film on the ridge portions. With respect to the cleavage properties, cracking can be kept from occurring if the configuration is one with lateral ridge portions formed on both sides of the central ridge portion (with a spacing between the central ridge portion and the lateral ridge portions of 30 μm or less). Also, element resistance can be reduced if in the configuration an n-type semiconductor layer is crystal grown on a p-type cladding layer. As above, there are no problems as long as the configuration of the lateral ridge portions meets the above conditions.

The present invention can also be applied to a similar semiconductor laser that is manufactured by a process that includes a burying growth step, and by doing so the same effects can be obtained.

The invention may be embodied in other specific forms without departing from the spirit or essential characteristics thereof The embodiments disclosed in this application are to be considered in all respects as illustrative and not restrictive, the scope of the invention being indicated by the appended claims rather than by the foregoing description. All changes that come within the meaning and range of equivalency of the claims are intended to be embraced therein.

What is claimed is:

1. A semiconductor laser of a ridge-type current confinement structure, comprising a first conduction-type cladding layer, a second conduction-type cladding layer, and an active layer that is sandwiched between these cladding layers, on a first conduction-type semiconductor substrate, wherein the second conduction-type cladding layer has mesa-type stripe-shaped recessed portions in at least four spots, so as to form a central ridge portion, which constitutes a ridge-type current confinement portion, and two or more lateral ridge portions of a height larger than that of the central ridge portion, which are positioned on both sides of the central ridge portion, and which include the second conduction-type cladding layer, wherein an insulation film with a lower refractive index than the second conduction-type cladding layer is formed into a pair of stripes disposed respectively in the regions from the side surface of the second conduction-type cladding layer on both side portions of the central ridge portion toward the outside, the insulation film not being formed on the central ridge portion, and wherein a current blocking layer is formed above the second conduction-type cladding layer of each of the lateral ridge portions.

2. The semiconductor laser according to claim 1, wherein the insulation film is not formed on the lateral ridge portions, and the height of the central ridge portion is lower than the height of the lateral ridge portions.

3. The semiconductor laser according to claim 2, wherein the current blocking layer is a first conduction-type semiconductor layer or a high resistance semiconductor layer.

4. The semiconductor laser according to claim 1, wherein the current blocking layer is formed on the uppermost layer of the lateral ridge portions.

5. The semiconductor layer according to claim 1, wherein (a+b)/L is 0.5 or less, where a symbol a represents a width of the central ridge portion, a symbol b represents a total width of the lateral ridge portions and a symbol L represents a width at which the central ridge portion is repeated.

6. The semiconductor laser according to claim 1, wherein a spacing d between the central ridge portion and the lateral ridge portions is 30μm or less.

7. The semiconductor laser according to claim 1, wherein, only in the vicinity of a laser end surface on the front side from which light is output or in the vicinity of the laser end surfaces on both the front side and the rear side, the insulation film is formed on the central ridge portion and on the lateral ridge portions, so as to form a region in which an injection of carriers to the active layer is inhibited.

8. The semiconductor laser according to claim 7, wherein the region in which the injection of carriers to the active layer is inhibited, which is formed only in the vicinity of the laser end surface on the front side from which the light is output, or is formed in the vicinity of the laser end surfaces on both the front side and the rear side, is set to a width of 15 to 30 μm from the laser end surface.

9. The semiconductor laser according to claim 1, wherein an electrode material that forms an ohmic junction with the second conduction-type semiconductor layer, which is the uppermost layer of the central ridge portion, is formed directly on the insulation film, the central ridge portion, and the lateral ridge portions.

10. The semiconductor laser according to claim 1, wherein a second conduction-type semiconductor layer and an electrode layer that forms an ohmic junction with the second conduction-type semiconductor layer, which is the uppermost layer of the central ridge portion, are formed in that order on the insulation film, the central ridge portion, and the lateral ridge portions.

11. The semiconductor laser according to claim 1, wherein a cross section shape of the central ridge portion is a regular mesa shape or a reverse mesa shape.

12. The semiconductor laser according to claim 1, wherein a width of a bottom portion of the central ridge portion (stripe width) is set within a range of 1 to 5μm.

13. The semiconductor laser according to claim 1, wherein the semiconductor substrate is GaAs, and the cladding layers, the active layer, the current blocking layer, and a burying layer are Group III-V compound semiconductors including at least one chosen from the group consisting of Al, Ga, As, P, and In.

14. The semiconductor laser according to claim 1, wherein the semiconductor substrate is InP, and the cladding layers, the active layer, the current blocking layer, and a burying layer are Group III-V compound semiconductors including at least one chosen from the group consisting of Al, Ga, As, P, and In.

15. The semiconductor laser according to claim 1, wherein the semiconductor substrate is GaN, sapphire, or SiC, and the cladding layers, the active layer, the current blocking layer, and a burying layer are Group III-V compound semiconductors including at least one chosen from the group consisting of Ga, In, and N.

16. The semiconductor laser according to claim 1, wherein the insulation film is formed in a single layer or a plurality of layers chosen from the group consisting of $SiO_2$, $SiN_x$, SiON, $Al_2O_3$, ZnO, SiC, and amorphous Si.

17. The semiconductor laser according to claim 1, wherein the first conduction-type semiconductor layer is an n-type semiconductor layer and the second conduction-type semiconductor is a p-type semiconductor layer.

18. A method for manufacturing a semiconductor laser, comprising:

forming at least a first conduction-type semiconductor layer, an active layer, and a second conduction-type semiconductor layer on a first conduction-type semiconductor substrate with (100) as a primary face;

etching the second conduction-type semiconductor layer in a stripe shape in the <011> direction to form at least four recessed portions, thereby forming a central ridge portion and two or more lateral ridge portions;

forming an insulation layer with a lower refractive index than the second conduction-type cladding layer over the surface;

removing the insulation film on the second conduction-type semiconductor layer by etching so as to expose the upper surface of the second conduction-type semiconductor layer formed at the central ridge portion and thereby form the remaining insulation film into a pair of stripes disposed respectively in the regions from the side surface of the second conduction-type cladding layer on both side portions of the central ridge portion toward the outside; and forming an electrode that forms an ohmic junction with the second conduction-type semiconductor layer.

19. The method of manufacturing a semiconductor laser according to claim 18, further comprising:

doping a dopant such as Zn and Si in high concentration to the active layer only in the vicinity of a laser end surface on a front side, where the light is output, or in the vicinity of the laser end surface on both the front side and the rear side, in order to form a region in which there is little light absorption, and forming a current blocking layer only in the vicinity of the laser end surface on the front side, where the light is output, or in the vicinity of the laser end surface on both the front side and the rear side.

20. A method for manufacturing a semiconductor layer having a central ridge portion constituting a ridge-type current confinement portion and at least two lateral ridge portions positioned on both sides of the central ridge portion, the method comprising:

forming a first conduction-type cladding layer, an active layer, a second conduction-type cladding layer, a second conduction-type contact layer, and a first conduction-type current blocking layer on a first conduction-type semiconductor substrate with (100) as a primary face;

etching the first conduction-type current blocking layer in a stripe shape in the <011> direction to leave the lateral ridge portions;

etching the exposed second conduction-type contact layer in a stripe shape in the <011> direction, leaving the central ridge portion and the lateral ridge portions;

using the second conduction-type contact layer as a mask and etching the second conduction-type cladding layer in a stripe shape in the <011> direction;

forming an insulation film with a lower refractive index than the second conduction-type cladding layer over the surface;

removing the insulation film on the central ridge portion and the lateral ridge portions by etching; and forming an electrode that forms an ohmic junction with the second conduction-type contact layer.

21. The method of manufacturing a semiconductor laser according to claim 20, further comprising:

doping a dopant such as Zn and Si in high concentration to the active layer only in the vicinity of a laser end surface on a front side, where the light is output, or in the vicinity of the laser end surface on both the front side and the rear side, in order to form a region in which there is little light absorption, and forming a current blocking layer only in the vicinity of the laser end surface on the front side, where the light is output, or in the vicinity of the laser end surface on both the front side and the rear side.

22. A method for manufacturing a semiconductor laser having a central ridge portion constituting a ridge-type current confinement portion and at least two lateral ridge portions positioned on both sides of the central ridge portion, the method comprising:

forming a first conduction-type cladding layer, an active layer, a second conduction-type cladding layer, a second conduction-type contact layer, and a first conduction-type or undoped semiconductor layer on a first conduction-type semiconductor substrate with (100) as a primary face;

etching the semiconductor layer in a stripe shape in the <011> direction, leaving the lateral ridge portions;

etching the exposed second conduction-type contact layer in a stripe shape in the <011> direction to leave the central ridge portion and the lateral ridge portions;

using the second conduction-type contact layer as a mask and etching the second conduction-type cladding layer in a stripe shape in the <011> direction;

forming an insulation film with a lower refractive index than the second conduction-type cladding layer over the surface;

removing the insulation film on the central ridge portion and the lateral ridge portions by etching;

providing high resistance by ion implantation after forming a mask for ion implantation that covers at least the central ridge portion, and forming an electrode that forms an ohmic junction with the second conduction-type contact layer.

23. The method of manufacturing a semiconductor laser according to claim 22, further comprising:

doping a dopant such as Zn and Si in high concentration to the active layer only in the vicinity of a laser end surface on a front side, where the light is output, or in the vicinity of the laser end surface on both the front side and the rear side, in order to form a region in which there is little light absorption, and forming a current blocking layer only in the vicinity of the laser end surface on the front side, where the light is output, or in the vicinity of the laser end surface on both the front side and the rear side.

* * * * *